United States Patent
Lee et al.

(10) Patent No.: US 10,194,538 B2
(45) Date of Patent: Jan. 29, 2019

(54) METHOD AND APPARATUS FOR MANUFACTURING A DISPLAY DEVICE

(71) Applicants: Samsung Display Co., Ltd., Yongin, Gyeonggi-Do (KR); Yodogawa Medec Co., Ltd., Suita-Shi, Osaka (JP)

(72) Inventors: Kyung-Su Lee, Yongin (KR);
Kwan-Young Han, Yongin (KR);
Jong-Hwan Kim, Yongin (KR);
Yong-Youl Cho, Yongin (KR);
Young-Sik Kim, Yongin (KR);
Yang-Han Son, Yongin (KR);
Dae-Hyun Hwang, Yongin (KR);
Kimura Shigeru, Osaka (JP)

(73) Assignees: Samsung Display Co., Ltd., Yongin-si (KR); Yodogawa Medec Co., Ltd., Osaka (JP)

( * ) Notice: Subject to any disclaimer, the term of this patent is extended or adjusted under 35 U.S.C. 154(b) by 385 days.

(21) Appl. No.: 14/803,025

(22) Filed: Jul. 17, 2015

(65) Prior Publication Data

US 2016/0021764 A1    Jan. 21, 2016

Related U.S. Application Data

(63) Continuation of application No. 13/931,795, filed on Jun. 28, 2013.

(30) Foreign Application Priority Data

Jun. 29, 2012 (KR) .......................... 10-2012-0071375
Feb. 8, 2013 (KR) .......................... 10-2013-0014650
May 30, 2013 (KR) .......................... 10-2013-0062110

(51) Int. Cl.
*H05K 5/00*        (2006.01)
*B32B 3/04*        (2006.01)
(Continued)

(52) U.S. Cl.
CPC ............. *H05K 5/0017* (2013.01); *B32B 3/04* (2013.01); *B32B 3/28* (2013.01); *B32B 7/12* (2013.01);
(Continued)

(58) Field of Classification Search
CPC ................ H05K 5/0017; H05K 5/0217; Y10T 428/24628; Y10T 428/24653;
(Continued)

(56) References Cited

U.S. PATENT DOCUMENTS 8,094,442 B2    1/2012  Sugawara
8,163,126 B2    4/2012  Harada et al.
(Continued)

FOREIGN PATENT DOCUMENTS

CN    101306620 A    11/2008
CN    101308263 A    11/2008
(Continued)

OTHER PUBLICATIONS

U.S. Office Action dated Dec. 8, 2017, issued in U.S. Appl. No. 13/931,795 (20 pages).
(Continued)

*Primary Examiner* — Vishal I Patel
(74) *Attorney, Agent, or Firm* — Lewis Roca Rothgerber Christie LLP

(57) ABSTRACT

A method of manufacturing a display device includes mounting a cover window including a curved portion on a first jig including a curved portion, mounting a panel member on a second jig that conforms to a surface of the first jig, and laminating the cover window to the panel member by moving a first one of the first jig or the second jig to a first other one of the first jig or the second jig. An apparatus for manufacturing a display device includes a first jig including a mount surface that is partially curved to conform to a
(Continued)

surface of a cover window, a second jig including a surface conforming to the mount surface and configured to contact a panel member, and a driving unit.

14 Claims, 11 Drawing Sheets

(51) Int. Cl.
| | | |
|---|---|---|
| *B32B 37/18* | (2006.01) | |
| *B32B 37/00* | (2006.01) | |
| *B32B 3/28* | (2006.01) | |
| *B32B 7/12* | (2006.01) | |
| *B32B 38/18* | (2006.01) | |
| *H05K 5/02* | (2006.01) | |

(52) U.S. Cl.
CPC .......... *B32B 37/0046* (2013.01); *B32B 37/18* (2013.01); *B32B 38/1866* (2013.01); *H05K 5/0217* (2013.01); *B32B 2307/412* (2013.01); *B32B 2457/20* (2013.01); *B32B 2457/208* (2013.01); *Y10T 156/10* (2015.01); *Y10T 156/1002* (2015.01); *Y10T 156/1744* (2015.01); *Y10T 428/24628* (2015.01); *Y10T 428/24653* (2015.01)

(58) Field of Classification Search
CPC ......... Y10T 156/1002; Y10T 156/1744; Y10T 156/10; B32B 2457/208; B32B 38/1866; B32B 2457/20; B32B 3/04; B32B 37/18; B32B 37/0046; B32B 3/28; B32B 7/12; B32B 2307/412
See application file for complete search history.

(56) References Cited

U.S. PATENT DOCUMENTS

| | | | |
|---|---|---|---|
| 8,212,970 B2 | 7/2012 | Nagata | |
| 8,773,848 B2 | 7/2014 | Russell-Clarke et al. | |
| 9,439,315 B2 | 9/2016 | Lee et al. | |
| 2002/0027636 A1 | 3/2002 | Yamada | |
| 2002/0180712 A1 | 12/2002 | Sato et al. | |
| 2003/0184217 A1 | 10/2003 | Yamazaki et al. | |
| 2005/0259423 A1 | 11/2005 | Heuser et al. | |
| 2006/0216909 A1 | 9/2006 | Yamazaki et al. | |
| 2006/0273304 A1 | 12/2006 | Cok | |
| 2008/0074022 A1 | 3/2008 | Wang et al. | |
| 2008/0227507 A1 | 9/2008 | Joo | |
| 2009/0002930 A1 | 1/2009 | Nakanishi et al. | |
| 2009/0277578 A1 | 11/2009 | Sung et al. | |
| 2010/0073593 A1 | 3/2010 | Sasaki et al. | |
| 2010/0090981 A1 | 4/2010 | Park et al. | |
| 2010/0103138 A1 | 4/2010 | Huang et al. | |
| 2010/0253902 A1* | 10/2010 | Yamazaki | G02F 1/1303 349/158 |
| 2010/0284132 A1* | 11/2010 | Yi | B29C 45/14467 361/679.01 |
| 2011/0050657 A1 | 3/2011 | Yamada | |
| 2011/0120619 A1 | 5/2011 | Harada et al. | |
| 2011/0146893 A1 | 6/2011 | Marty et al. | |
| 2011/0199348 A1 | 8/2011 | Takatani et al. | |
| 2012/0051067 A1 | 3/2012 | Murray | |
| 2012/0081874 A1 | 4/2012 | Wu et al. | |
| 2012/0111479 A1* | 5/2012 | Sung | B32B 17/10036 156/102 |
| 2012/0120023 A1* | 5/2012 | Huang | G06F 3/041 345/175 |
| 2012/0218651 A1 | 8/2012 | Onishi et al. | |
| 2012/0236526 A1 | 9/2012 | Weber | |
| 2012/0242588 A1 | 9/2012 | Myers et al. | |
| 2012/0275097 A1 | 11/2012 | Lee | |
| 2013/0002133 A1 | 1/2013 | Jin et al. | |
| 2013/0002583 A1 | 1/2013 | Jin et al. | |
| 2013/0188366 A1 | 7/2013 | Russell-Clarke et al. | |
| 2014/0002975 A1 | 1/2014 | Lee et al. | |
| 2014/0104762 A1 | 4/2014 | Park | |
| 2014/0140037 A1 | 5/2014 | Cho | |
| 2014/0233194 A1 | 8/2014 | Hongo et al. | |
| 2015/0293390 A1 | 10/2015 | Tsunekawa | |

FOREIGN PATENT DOCUMENTS

| | | |
|---|---|---|
| CN | 101334547 A | 12/2008 |
| CN | 102066110 A | 5/2011 |
| CN | 102119077 A | 7/2011 |
| CN | 203415180 U | 1/2014 |
| JP | 07-114347 A | 5/1995 |
| JP | 2005-161528 A | 6/2005 |
| JP | 2006-248651 A | 9/2006 |
| JP | 2007-326259 A | 12/2007 |
| JP | 2008-060376 A | 3/2008 |
| JP | 4567941 B2 | 10/2010 |
| KR | 10-2006-0129848 A | 12/2006 |
| KR | 10-2008-0056823 A | 6/2008 |
| KR | 10-0864407 B1 | 10/2008 |
| KR | 10-2009-0057967 A | 6/2009 |
| KR | 10-2010-0041450 A | 4/2010 |
| KR | 10-2012-0029090 A | 3/2012 |
| KR | 10-2012-0040783 A | 4/2012 |
| WO | WO 2011/010873 A2 | 1/2011 |
| WO | WO 2012/036389 A2 | 3/2012 |

OTHER PUBLICATIONS

SIPO Office Action, with English translation, dated Feb. 28, 2017, for corresponding Chinese Patent Application No. 201410386628.X (25 pages).
European Search Report dated Oct. 28, 2013 issued in European Patent Application 13173931.0, 5 pages.
SIPO Office action dated Jan. 19, 2016, for corresponding Chinese Patent application 201410386628.X, (9 pages).
U.S. Office action dated Jan. 15, 2016, for cross reference U.S. Appl. No. 13/931,795, (20 pages).
SIPO Office action dated Oct. 9, 2016, for corresponding Chinese Patent application 201310269434.7 (6 pages).
U.S. Office action dated Jul. 6, 2015, for cross reference U.S. Appl. No. 13/931,795 (21 pages).
U.S. Office action dated Jul. 8, 2016, for cross reference U.S. Appl. No. 13/931,795 (25 pages).
U.S. Notice of Allowance dated May 6, 2016, for cross reference U.S. Appl. No. 13/871,970 (9 pages).
U.S. Office Action dated Jan. 4, 2017, issued in cross-reference U.S. Appl. No. 13/931,795 (17 pages).
U.S. Office Action dated Aug. 29, 2017, issued in cross-reference U.S. Appl. No. 15/235,023 (7 pages).
Abstract and partial English translation of relevant parts of JP 2007-326259 A dated Dec. 20, 2007, listed above (2 pages).
TIPO Office Action dated Oct. 21, 2016, with English Translation, for corresponding Taiwanese Patent Application No. 102122915 (34 pages).
www.merriam-webster.com/dictionary/flat, accessed Jul. 24, 2018 (Year: 2018).
U.S. Final Office Action dated Aug. 1, 2018, issued in U.S. Appl. No. 14/794,720, 19 pages, citing the references listed above.

\* cited by examiner

METHOD AND APPARATUS FOR MANUFACTURING A DISPLAY DEVICE

CROSS-REFERENCE TO RELATED PATENT APPLICATION

This application is a continuation and divisional of U.S. patent application Ser. No. 13/931,795, filed on Jun. 28, 2013, which claims priority to and the benefit of Korean Patent Application No. 10-2012-0071375, filed on Jun. 29, 2012 in the Korean Intellectual Property Office, and of Korean Patent Application No. 10-2013-0014650, filed on Feb. 8, 2013 in the Korean Intellectual Property Office, and Korean Patent Application No. 10-2013-0062110, filed on May 30, 2013 in the Korean Intellectual Property Office, the entire contents of all of which are incorporated herein by reference.

BACKGROUND

1. Field

Aspects of embodiments of the present invention relate to a method and apparatus for manufacturing the display device.

2. Description of the Related Art

Electronic devices based on portability are widely used. Portable electronic devices that have recently been widely used include small electronic devices such as mobile phones as well as tablet personal computers (PCs). In order to support various functions, portable electronic devices include a display device for providing visual information such as an image to a user. Recently, as sizes of components for driving display devices have decreased, the importance of display devices in electronic devices has increased. Accordingly, display devices (such as flexible display devices) that bend at a set angle (for example, a predetermined angle) have been developed.

In general, flexible display devices that may bend at a set angle may be manufactured using a flexible process, such as being flexibly manufactured. Since a flexible display device may be formed of a flexible material, the flexible display device may have any of various shapes. A flexible display device may be manufactured by forming a light-emitting unit on a substrate to form a display unit, and sealing the display unit by using an encapsulation unit, which may increase a lifetime of the display unit. The substrate may be formed of a flexible material, and the encapsulation unit may be formed, for example, as a substrate or a thin film. As designs of electronic devices have recently been diversified, demands for flexible display devices have increased.

SUMMARY

Embodiments of the present invention provide for a method and apparatus for manufacturing the display device.

According to an embodiment of the present invention, a method of manufacturing a display device is provided. The method includes mounting a cover window including a curved portion on a first jig including a flat portion having curved both ends, mounting a panel member on a second jig that conforms to a surface of the first jig, and laminating the cover window to the panel member by moving a first one of the first jig or the second jig to a first other one of the first jig or the second jig.

At least a portion of the panel member may contact a surface of the second jig.

The panel member may be bent along an outer surface of the second jig during the mounting of the panel member on the second jig.

The panel member may be smaller in at least one of a length or a width than the cover window.

The panel member may be flat during the mounting of the panel member on the second jig. The laminating of the cover window to the panel member may include partially curving the panel member by the moving of the first one of the first jig or the second jig.

The first one of the first jig or the second jig may be above the first other one of the first jig or the second jig, or the first other one of the first jig or the second jig may be above the first one of the first jig or the second jig.

A second one of the first jig or the second jig may be formed by protruding toward or recessing away from a second other one of the first jig or the second jig.

The second other one of the first jig or the second jig may be formed by recessing away from or protruding toward the second one of the first jig or the second jig.

The mounting of the panel member may include fixing the panel member to the second jig.

The panel member may be flexible.

The panel member may be attached to a recessed outer surface of the cover window or a protruding outer surface of the cover window.

The panel member may include at least one of a display panel or a touch screen panel (TSP).

According to another embodiment of the present invention, an apparatus for manufacturing a display device is provided. The apparatus includes a first jig including a mount surface that is partially curved to conform to a surface of a cover window that comprises flat portion having curved both ends, a second jig including a surface conforming to the mount surface and configured to contact a panel member, and a driving unit connected to a first one of the first jig or the second jig and configured to move the first one of the first jig or the second jig.

The first jig may further include a first fixing unit for fixing the cover window to the mount surface. The second jig may further include a second fixing unit for fixing the panel member to the surface conforming to the mount surface.

The first fixing unit or the second fixing unit may include an absorption unit, and an absorption pump for evacuating air from the absorption unit.

The apparatus may further include a cushion unit at an outer surface of at least one of the first jig or the second jig.

The cushion unit may include a plurality of cushion units at respective ends of the at least one of the first jig or the second jig. A distance between the cushion units may be less than at least one of a length or a width of the panel member.

A second one of the first jig or the second jig may be formed by protruding toward or recessing away from another one of the first jig or the second jig.

The other one of the first jig or the second jig may be formed by recessing away from or protruding toward the second one of the first jig or the second jig.

The panel member may be configured to be attached to a recessed outer surface of the cover window or a protruding outer surface of the cover window.

The panel member may include at least one of a display panel or a touch screen panel (TSP).

The apparatus may further include a clamping unit spaced from the second jig and configured to support the panel member.

The clamping unit may include a plurality of clamping units. A distance between the clamping units may be less than at least one of a length or a width of the panel member when the clamping units support the panel member.

The apparatus may further include a linear driving unit coupled to the clamping unit and configured to linearly move the clamping unit.

The linear driving unit may be further configured to linearly move the clamping unit in a same direction as a moving direction of the second jig.

The linear driving unit may be further configured to linearly move the clamping unit in a diagonal direction of a moving direction of the second jig.

At least one of the first jig or the second jig may further include a cushion unit at an outer surface of the at least one of the first jig or the second jig.

A second one of the first jig or the second jig may be formed by protruding toward or recessing away from another one of the first jig or the second jig.

The other one of the first jig or the second jig may be formed by protruding toward or recessing away from the second one of the first jig or the second jig.

The panel member may be configured to be attached to a recessed outer surface of the cover window or a protruding outer surface of the cover window.

The panel member may include least one of a display panel or a touch screen panel (TSP).

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, the present invention will be described more fully with reference to the accompanying drawings, in which exemplary embodiments are shown. The present invention may, however, be embodied in many different forms and should not be construed as being limited to the embodiments set forth herein. These embodiments are provided to make this disclosure more thorough, and to help convey concepts of the invention to one of ordinary skill in the art. The terminology used herein is for describing particular embodiments only and is not intended to be limiting of the present invention.

As used herein, the term "and/or" includes any and all combinations of one or more of the associated listed items. Expressions such as "at least one of," when preceding a list of elements, modify the entire list of elements and do not modify the individual elements of the list. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It will be understood that, although the terms first, second, third, etc., may be used herein to describe various elements, these elements should not be limited by these terms. These terms are only used to distinguish one element from another element.

In the embodiments of the present invention, examples of display devices include various display devices. For example, examples of display devices include liquid crystal display devices and organic light-emitting display devices. However, for convenience of description, it will be assumed that the display devices are organic light-emitting display devices. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

Figure 1:
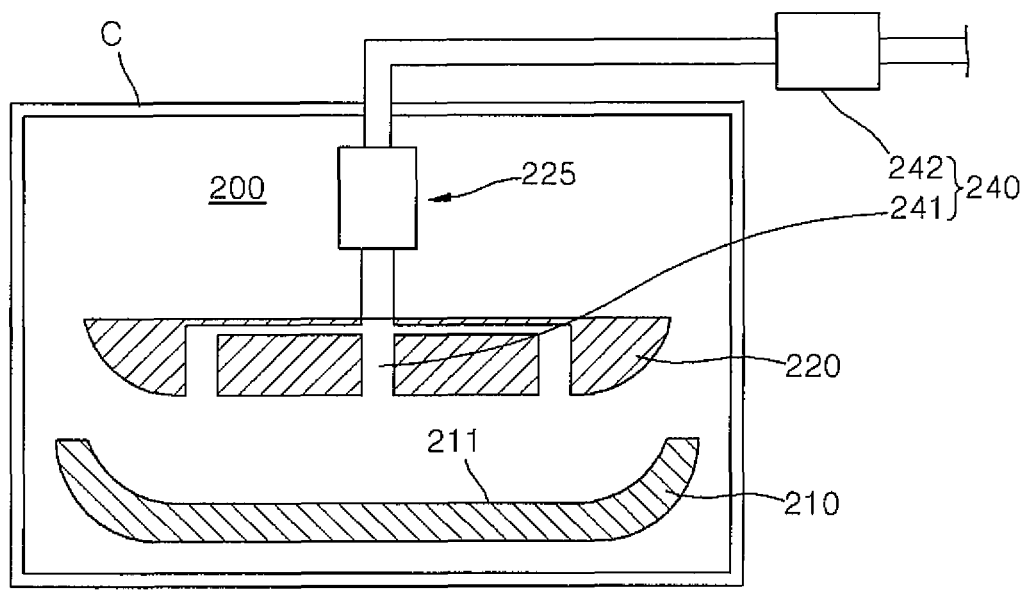
FIG. 1 is a cross-sectional view illustrating an apparatus for manufacturing the display device according to an embodiment of the present invention.
Figure 2A:
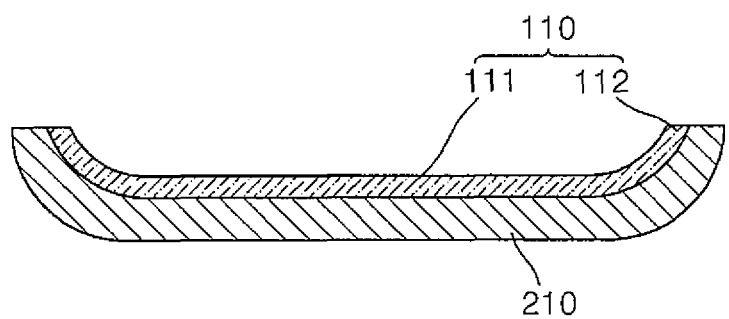
FIGS. 2A through 2C are cross-sectional views illustrating a method of manufacturing the display device according to an embodiment of the present invention.
Figure 2B:
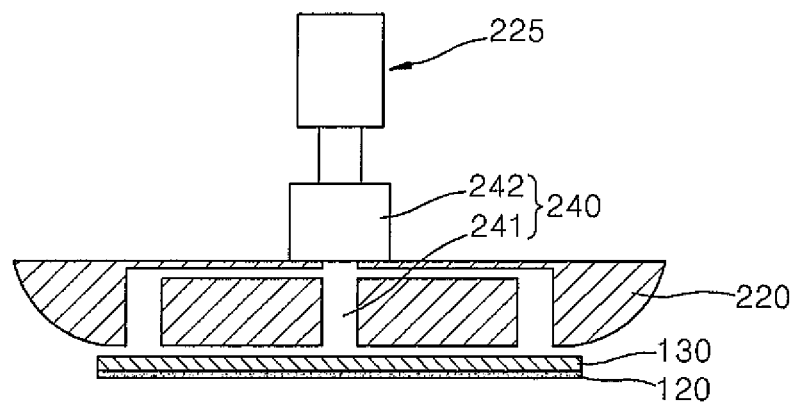
Figure 2C:
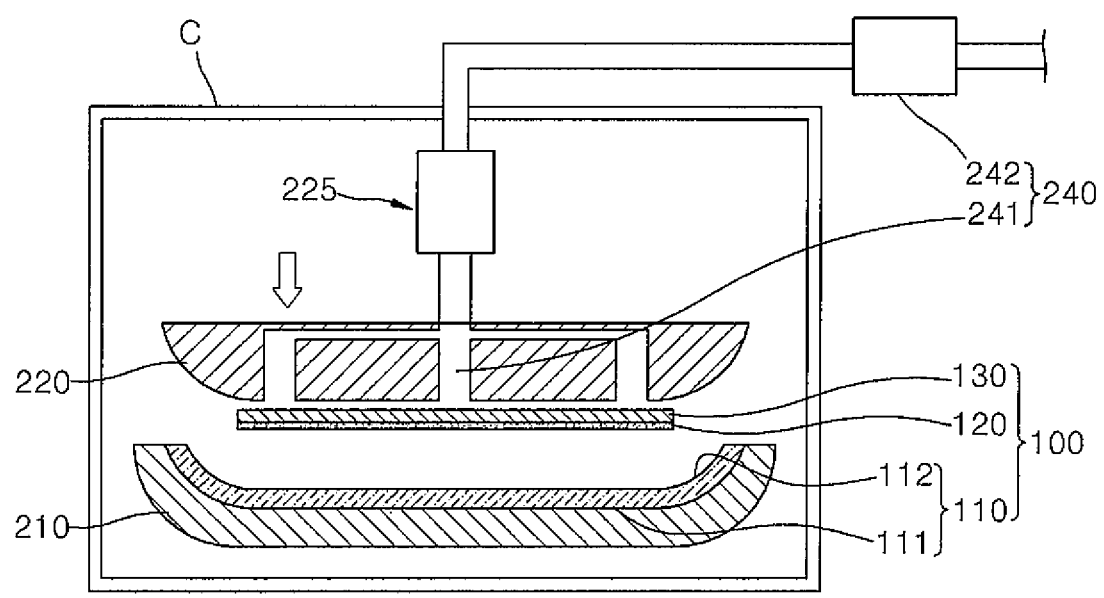

FIG. 1 is a cross-sectional view illustrating an apparatus 200 for manufacturing the display device 100 according to an embodiment of the present invention. FIGS. 2A through 2C are cross-sectional views illustrating a method of manufacturing the display device 100 according to an embodiment of the present invention.

Referring to FIGS. 1 through 2C, the apparatus 200 includes a first jig 210 that is partially curved and has a mount surface 211 that conforms to one surface of the cover window 110. In FIGS. 1 through 2C, the first jig 210 has a shape similar to that of the cover window 110. That is, the mount surface 211 of the first jig 210 is curved. In addition, the mount surface 211 has a flat portion on which the flat portion 111 of the cover window is mounted and the mount surface 211 has curved portions on which the curved portions 112 of the cover window are mounted. For example, the mount surface 211 may be formed by being recessed in the first jig 210.

The apparatus 200 includes a second jig 220 that detachably couples to the first jig 210. One surface of the second jig 220 conforms to the mount surface 211. In FIGS. 1 through 2C, one surface of the second jig 220 is curved in places to conform to the portions of the mount surface 211 that are curved, and is flat in places to conform to the portion of the mount surface 211 that is flat. That is, the second jig 220 is curved such that the second jig 220 protrudes toward the first jig 210. A panel member (not shown) is mounted on the flat surface of the second jig 220. The panel member may include at least one of the display panel 130 or a touch screen panel (TSP, not shown). In detail, the panel member may include only the display panel 130 and may be attached to the cover window 110. The panel member may be flexible. However, for convenience of explanation, a case where the panel member includes only the display panel 130 will be explained.

The apparatus 200 may include a driving unit (such as second driving unit 225) that is connected to at least one of the first jig 210 or the second jig 220, and that moves the corresponding at least one of the first jig 210 or the second jig 220. The driving unit may include a first driving unit that moves the first jig 210 and the second driving unit 225 that moves the second jig 220. The first driving unit and the second driving unit 225 may be formed similarly. For convenience of description, it will be assumed that the second driving unit 225 is provided.

The second driving unit 225 may include any of various devices. For example, the second driving unit 225 may include a cylinder that operates by air pressure or oil pressure to move the second jig 220. In other embodiments, the second driving unit 225 may include a motor that operates by electricity to move the second jig 220. For convenience of description, it will be assumed that the second driving unit 225 includes a cylinder.

The apparatus 200 includes a fixing unit (for example, second fixing unit 240) that prevents or helps prevent the cover window 110 mounted on the first jig 210 from moving, or that prevents or helps prevent the display panel 130 and the adhesive layer 120 mounted on the second jig 220 from separating from the second jig 220. The fixing unit includes an absorption unit (for example, second absorption unit 241) that is formed on at least one of the first jig 210 or the second jig 220. In addition, the fixing unit includes an absorption pump (for example, second absorption pump 242) that absorbs (for example, vacuums or evacuates) air from the absorption unit. In particular, the absorption pump may be provided outside a chamber C as described below. The fixing unit is not limited thereto and, in other embodiments, may be formed in other various ways as would be apparent to one of ordinary skill in the art. For example, the fixing unit may be a separate frame that is formed on the first jig 210 or the second jig 220. As another example, the fixing unit may be an adhesive member having an adhesive force.

The fixing unit may include a first fixing unit that is provided on the first jig 210, and includes a second fixing unit 240 that is provided on the second jig 220. The first fixing unit and the second fixing unit 240 may be formed similarly. For example, the first fixing unit and the second fixing unit 240 may fix the cover window 110 and the display panel 130, respectively, by using air. In other embodiments, the first fixing unit and the second fixing unit 240 may fix the cover window 110 and the display panel 130, respectively, by using a separate frame. However, for convenience of description, it will be assumed that only the second fixing unit 240 is used and the display panel 130 is fixed by using air.

Accordingly, the apparatus 200 may rapidly and easily manufacture the display device 100 having a curved shape and a simple structure. In addition, since the apparatus 200 may accurately laminate the cover window 110 having a curved shape to the display panel 130, a defect rate may be reduced or minimized. A method of manufacturing the display device 100 by using the apparatus 200 will now be described with reference to FIGS. 2A through 2C.

In order to manufacture the display device 100, the cover window 110 is first fabricated. The cover window 110 may include any of various materials. For example, the cover window 110 may be formed of a glass material or a plastic material. The cover window 110 is not limited thereto and, in other embodiments, may include any material as long as the cover window 110 is partially curved or capable of being partially curved.

The display panel 130 may be manufactured before, during, or after the cover window 110 is manufactured. A method of manufacturing the display panel 130 may be substantially the same as a method of manufacturing a general display panel (as would be apparent to one of ordinary skill in the art) and thus, a further detailed description thereof will not be given.

Once the display panel 130 is prepared, the adhesive layer 120 is attached to one surface of the display panel 130. For example, the adhesive layer 120 may be attached to the display panel 130. The adhesive layer 120 may, for example, be attached as a film to the display panel 130, or be applied as a material to the display panel 130. However, for convenience of description, it will be assumed that the adhesive layer 120 is formed as a film.

After the adhesive layer 120 is attached to the display panel 130, the cover window 110 and the display panel 130 are respectively mounted on the first jig 210 and the second jig 220. That is, the cover window 110 is mounted on the first jig 210, and the display panel 130 is mounted on the second jig 220. The first jig 210 may be below the second jig 220 (for example, in a gravity direction).

Next, the distance between the first jig 210 and the second jig 220 is decreased. For example, the first jig 210 may move toward the second jig 220, or the second jig 220 may move toward the first jig 210. In other embodiments, both the first jig 210 and the second jig 220 may move closer to each other. However, for convenience of description, it will be assumed that the second jig 220 moves.

One surface of the first jig 210 is curved to conform (for example, closely attach) to one surface of the cover window 110. In FIGS. 2A and 2C, the surface of the first jig 210 is curved by being recessed. In addition, the display panel 130 is mounted on one surface of the second jig 220. The second fixing unit 240 fixes the display panel 130 to the surface of the second jig 220.

In FIGS. 2B and 2C, when the display panel 130 is mounted on the second jig 220, a second absorption unit 241 contacts, adheres, or is otherwise attached or fixed to one surface of the display panel 130. The second absorption unit 241 is partially exposed through an outer surface of the second jig 220. When the display panel 130 is positioned in this manner, the second absorption pump 242 absorbs air from the second absorption unit 241 (for example, by creating a partial vacuum or a pressure difference). Since the display panel 130 closes (for example, occludes) all or a portion of the second absorption unit 241, and air in the second absorption unit 241 is continuously absorbed (for example, vacuumed or evacuated), the second absorption unit 241 is in an almost vacuum state. When the second absorption pump 242 operates as described above, the display panel 130 attached to the second jig 220 is not separated from the second jig 220 due to the pressure difference.

In FIGS. 1 through 2C, a plurality of second absorption units 241 is provided. The second absorption units 241 are exposed or partially exposed through an outer surface of the second jig 220 as described above and are spaced apart from one another by a set interval (for example, a predetermined interval, such as evenly spaced).

When the cover window 110, the adhesive layer 120, and the display panel 130 are prepared as described above, the second jig 220 is moved toward the first jig 210 by driving the second driving unit 225. For example, the second driving unit 225 may be programmed to operate for a set period of time (for example, a predetermined period of time). When the second driving unit 225 operates in this manner, the second jig 220 approaches the first jig 210. When the second jig 220 is continuously moved toward the first jig 210, the adhesive layer 120 contacts the cover window 110.

When the second driving unit 225 continuously operates, the adhesive layer 120 contacting the flat portion 111 is compressed against the flat portion 111. Thus, the display panel 130 and the cover window 110 may be attached to each other through lamination.

In particular, when the cover window 110 and the display panel 130 contact each other, a load range applied when the first jig 210 and the second jig 220 compress the cover window 110 and the display panel 130 may be greater than or equal to 0.3 MPa and less than or equal to 0.5 MPa. When the load range is less than 0.3 MPa, an adhesive force between the cover window 110 and the display panel 130 may be reduced, and the cover window 110 and the display panel 130 may be delaminated and separated from each other. In addition, when the load range exceeds 0.5 MPa and the cover window 110 and the display panel 130 are attached to each other, the cover window 110 and the display panel 130 may be damaged, thereby reducing quality and reliability.

The operation may be performed, for example in an atmospheric state or a vacuum state (such as a near vacuum state). The apparatus 200 may include the first jig 210, and the chamber C in which the second jig 220 is disposed. In addition, the apparatus 200 may include a pressure adjustment unit that adjusts a pressure of the chamber C. When a pressure in the chamber C is maintained in a vacuum state, vapor formation between the cover window 110 and the display panel 130 when the cover window 110 and the display panel 130 are laminated may be effectively prevented.

Accordingly, the method may rapidly and accurately manufacture the display device 100 having a curved shape. Since the method accurately laminates the cover window 110 having a curved shape to the display panel 130, a defect rate may be reduced or minimized, and product quality may be improved.

Figure 3:
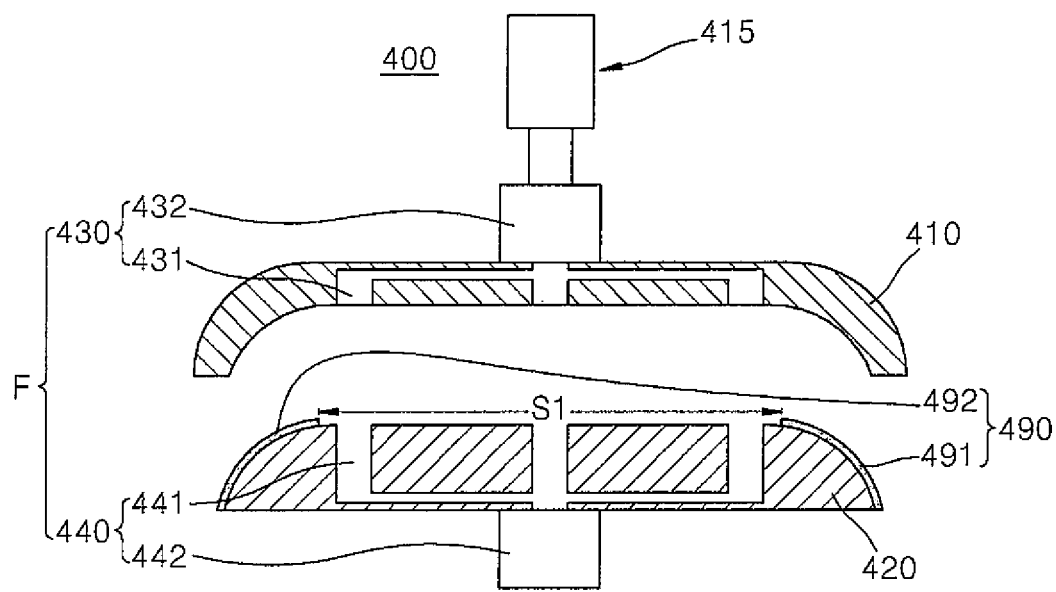
FIG. 3 is a cross-sectional view illustrating an apparatus for manufacturing the display device according to another embodiment of the present invention.
Figure 4A:
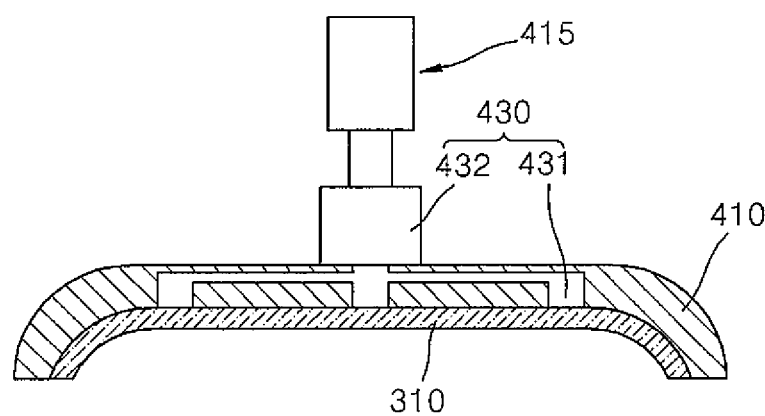
FIGS. 4A through 4C are cross-sectional views illustrating a method of manufacturing the display device according to another embodiment of the present invention.
Figure 4B:
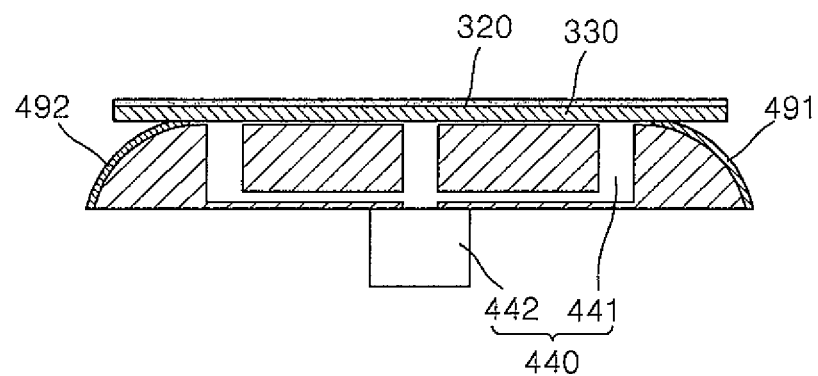
Figure 4C:
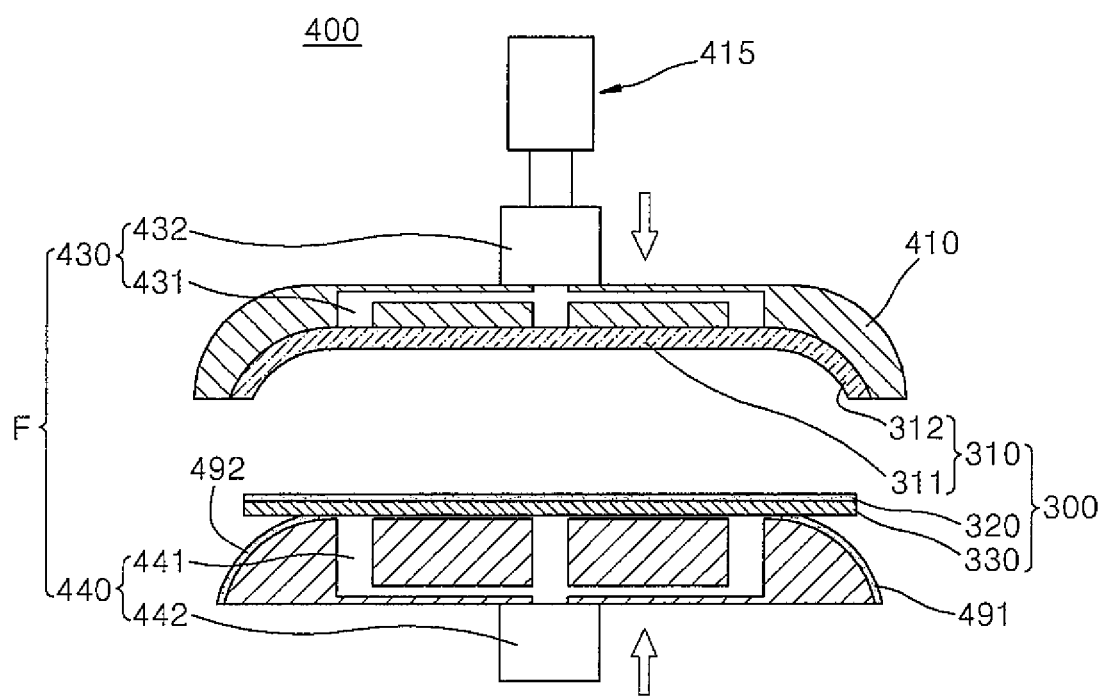

FIG. 3 is a cross-sectional view illustrating an apparatus 400 for manufacturing the display device 300 5 according to another embodiment of the present invention. FIGS. 4A through 4C are cross-sectional views illustrating a method of manufacturing the display device 300 according to another embodiment of the present invention.

Referring to FIGS. 3 through 4C, the apparatus 400 includes a first jig 410, a second jig 420, a driving unit (such as first driving unit 415), and a fixing unit F (for example, first fixing unit 430 and second fixing unit 440). The first jig 410, the second jig 420, the driving unit, and the fixing unit F are similar to the first jig 210, the second jig 220, the driving unit (for example, the second driving unit 225), and the fixing unit (for example, second fixing unit 240), respectively, as described above and thus, a detailed description thereof will not be repeated.

The driving unit may include the first driving unit 415 and a second driving unit, and the fixing unit F includes the first fixing unit 430 and the second fixing unit 440. The first driving unit 415, the second driving unit, the first fixing unit 430, and the second fixing unit 440 are substantially the same as the first driving unit, the second driving unit 225, the first fixing unit, and the second fixing unit 240, respectively, as described above and thus, a detailed description thereof will not be repeated. However, it will be assumed that the driving unit including only the first driving unit 415 operates.

The apparatus 400 may include a cushion unit 490 provided on or a part of at least one of the first jig 410 or the second jig 420. In this embodiment, a thickness of the cushion unit 490 may be greater than or equal to 0.5 mm and less than or equal to 3 mm. For convenience of description, however, it will be assumed that the cushion unit 490 is part of a surface of the second jig 420.

In FIGS. 3 through 4C, a plurality of cushion units 490 are part of respective end portions of the second jig 420 to face the first jig 410. The cushion units 490 include a first cushion unit 491 and a second cushion unit 492 that are part of a surface of the second jig 420 and spaced apart by a set interval (for example, a predetermined interval) from each other. The distance S1 between the first cushion unit 491 and the second cushion unit 492 is less than the at least one of a length or a width of the display panel 330. For convenience of description, however, it will be assumed that the distance S1 between the first cushion unit 491 and the second cushion unit 492 is less than the width of the display panel 330.

The cushion units 490 support the display panel 330 and help prevent air bubbles from being formed between the display panel 330 and the curved portions 312 when the second jig 420 and the first jig 410 are moved toward each other with the display panel 330 and the cover window 310, respectively, therebetween.

Accordingly, the apparatus 400 may rapidly and easily manufacture the display device 300 having a curved shape and a simple structure. In addition, since the apparatus 400 may accurately laminate the cover window 310 having a curved shape to the display panel 330, a defect rate may be reduced or minimized. Further, since the apparatus 400 (such as the second jig 420) includes the cushion unit 490, a defect rate that may increase during lamination of the display panel 330 to the cover window 310 on the curved portions 312 may be reduced.

A method of manufacturing the display device 300 will now be described with reference to FIGS. 3 through 4C.

A method of manufacturing the display device 300 by using the apparatus 400 is similar to that described above. For example, the cover window 310 and the display panel 330 may be manufactured as described above and may be mounted on the first jig 410 and the second jig 420, respectively (see FIG. 4A). Next, the first fixing unit 430 and the second fixing unit 440 respectively fix the cover window 310 and the display panel 330 to the first jig 410 and the second jig 420. When a first absorption pump 432 operates, a first absorption unit 431 is maintained in a vacuum (or near vacuum) state. Likewise, when a second absorption pump 442 operates, a second absorption unit 441 is maintained in a vacuum (or near vacuum) state. Accordingly, the cover window 310 and the display panel 330 are fixed to the first jig 410 and the second jig 420, respectively.

In FIGS. 3 through 4C, the first jig 410 is higher than the second jig 420 (for example, in a gravity direction). At least one of the first jig 410 or the second jig 420 then moves towards the other. For example, the first jig 410 may move toward the second jig 420, or the second jig 420 may move toward the first jig 410. In other embodiments, both the first jig 410 and the second jig 420 move closer to each other.

However, for convenience of description, it will be assumed that the first jig 410 moves toward the second jig 420. When the first jig 410 moves toward the second jig 420, the first driving unit 415 operates. When the first driving unit 415 continuously operates, a curved surface of the cover window 310 contacts the adhesive layer 320.

At first, the display panel 330 and the adhesive layer 320 may be flat against the second jig 420. Then, when the adhesive layer 320 and the cover window 310 contact each other, both ends of the display panel 330 and the adhesive layer 320 may be curved (for example, through contact with the cover window 310 that is curved). Next, a first display panel portion (that is flat) and second display panel portions (that are curved) of the display panel 330 are formed. Accordingly, the first display panel portion and the second display panel portions are formed when the display panel 330 is adhered to the flat portion 311 and the curved portions 312. The cover window 310 may be attached to the display panel 330 through lamination as the first driving unit 415 operates as described above (see FIG. 4C). In other embodiments, the display panel 330 and the adhesive layer 320 may be bent along an outer surface of the second jig 420 when the display panel 330 and the adhesive layer 320 are mounted on the second jig 420.

In particular, when the cover window 310 and the display panel 330 contact each other, a load range applied when the first jig 410 and the second jig 420 compress the cover window 310 and the display panel 330 may be greater than or equal to 0.3 MPa and less than or equal to 0.5 MPa. When the load range is less than 0.3 MPa, an adhesive force between the cover window 310 and the display panel 330 may be reduced, and thus the cover window 310 and the display panel 330 may be delaminated and separated from each other. In addition, when the load range exceeds 0.5 MPa and the cover window 310 and the display panel 330 are attached to each other, the cover window 310 and the display panel 330 may be damaged, thereby reducing quality and reliability.

Accordingly, the method may rapidly and accurately manufacture the display device 300 having a curved shape. Since the method accurately laminates the cover window 310 having a curved shape to the display panel 330, a defect rate may be reduced or minimized. In addition, since the method removes air bubbles that may be formed (or prevents air bubbles from being formed) after the display panel 330 and the curved portions 312 are compressed, product quality may be improved.

Figure 5:
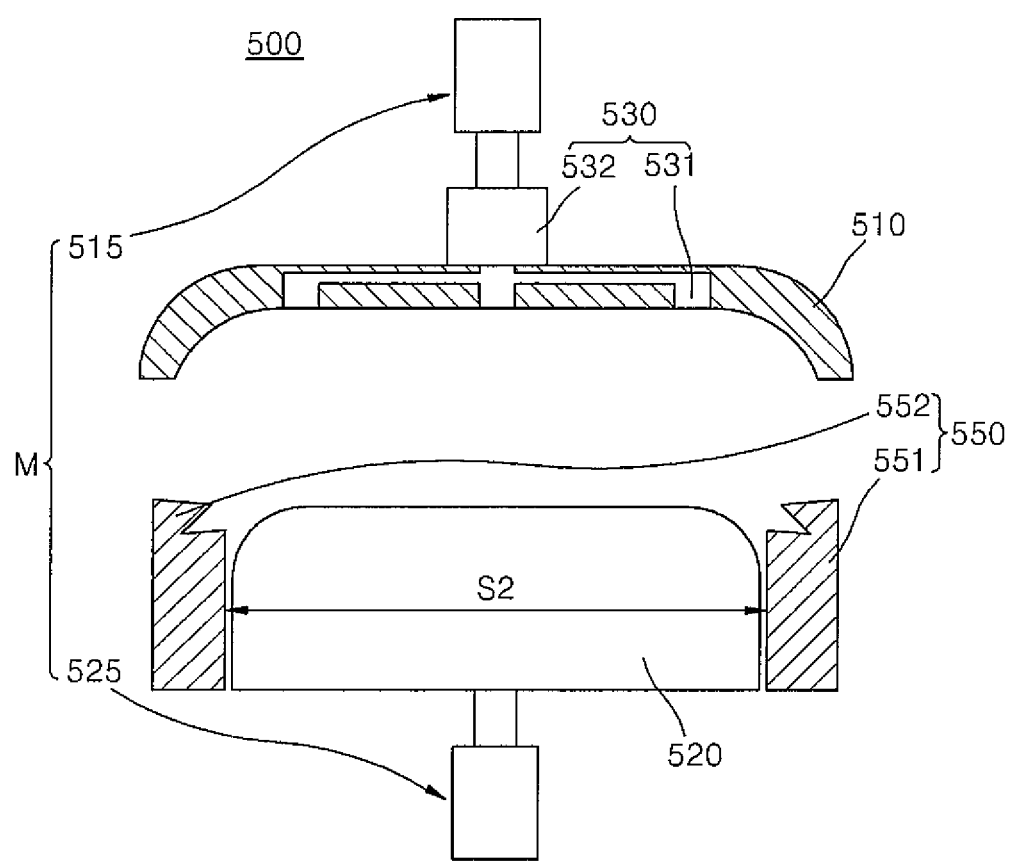
FIG. 5 is a cross-sectional view illustrating an apparatus for manufacturing the display device according to yet another embodiment of the present invention.
Figure 6A:
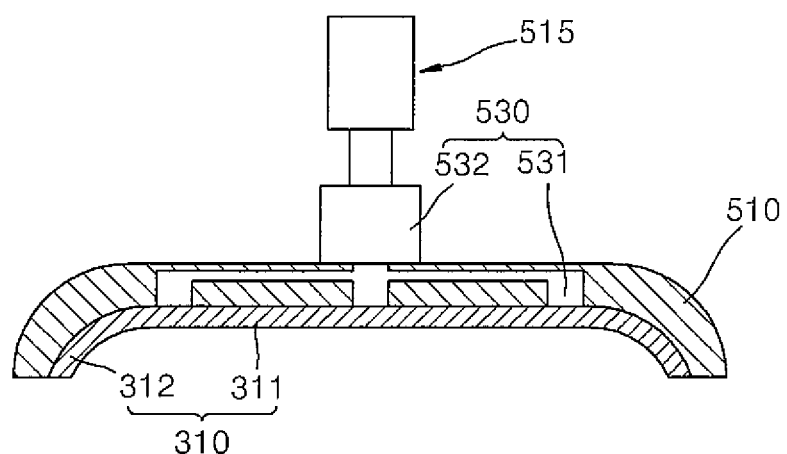
FIGS. 6A through 6C are cross-sectional views illustrating a method of manufacturing the display device according to yet another embodiment of the present invention.
Figure 6B:
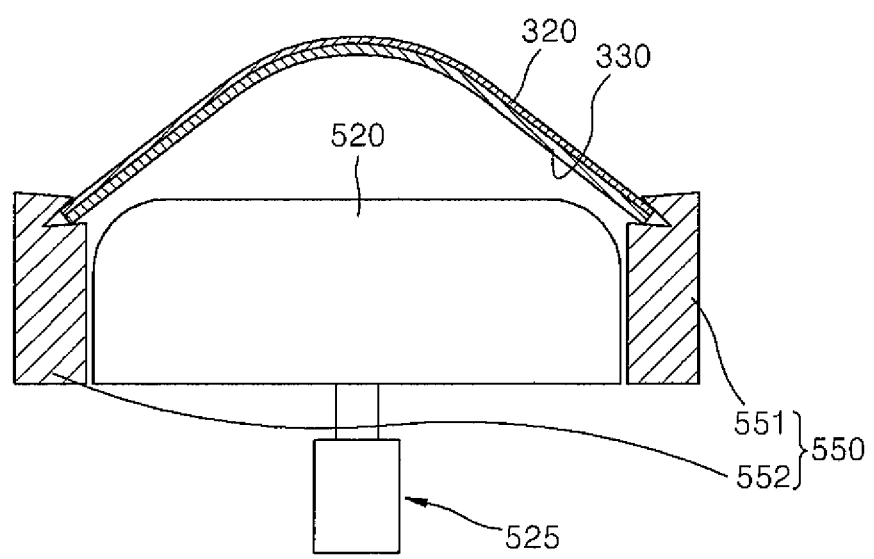
Figure 6C:
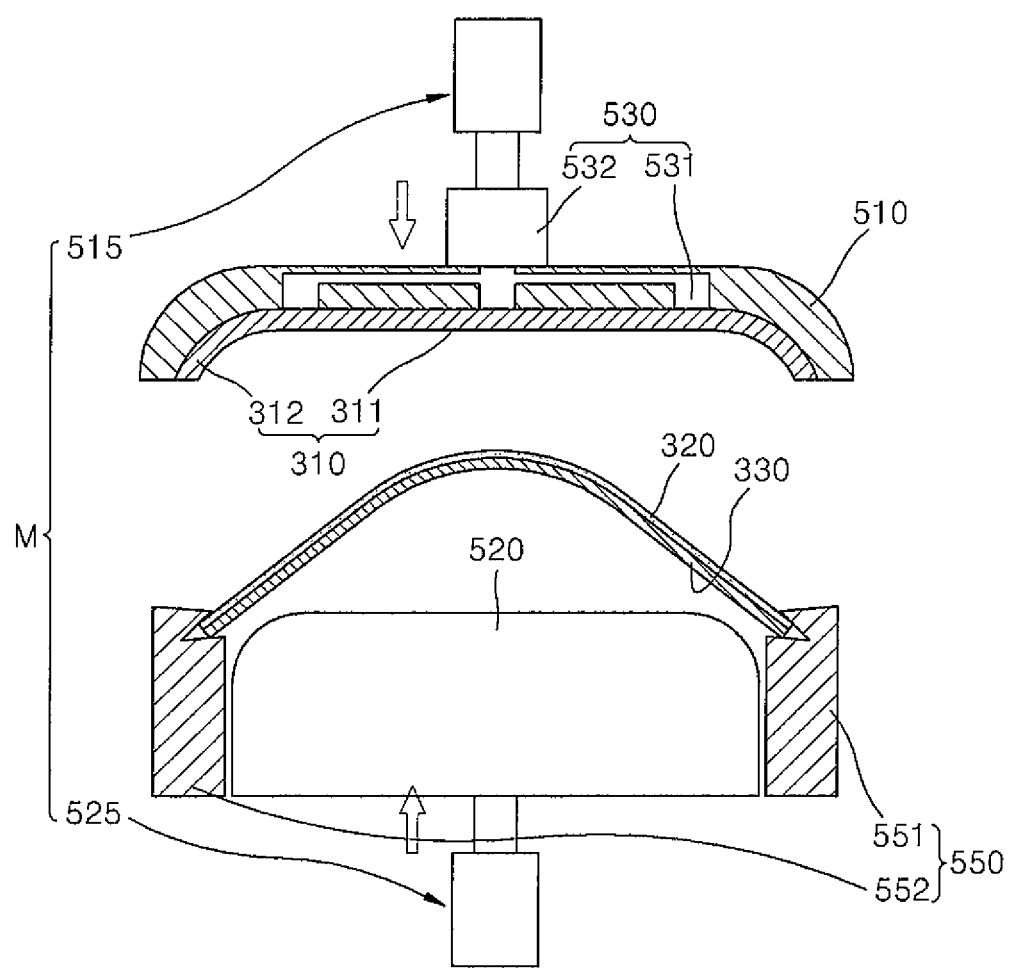

FIG. 5 is a cross-sectional view illustrating an apparatus 500 for manufacturing the display device 300 according to yet another embodiment of the present invention. FIGS. 6A through 6C are cross-sectional views illustrating a method of manufacturing the display device 300 according to yet another embodiment of the present invention.

Referring to FIGS. 5 through 6C, the apparatus 500 includes a first jig 510, a second jig 520, a driving unit M (such as first driving unit 515 and second driving unit 525), and a fixing unit (for example, first fixing unit 530). The first jig 510, the second jig 520, the driving unit M, and the fixing unit are substantially the same as those described above and thus, a detailed description thereof will not be repeated. The driving unit M may include the first driving unit 515 and the second driving unit 525, and the fixing unit includes the first fixing unit 530 (including first absorption unit 531 and first absorption pump 532). The first driving unit 515, the second driving unit 525, and the first fixing unit 530 are substantially the same as those described above and thus, a detailed description thereof will not be repeated.

The apparatus 500 includes a clamping unit 550 that is spaced apart by a set interval (for example, a predetermined interval) from the second jig 520, and supports the display panel 330 to which the adhesive layer 320 is applied. In other embodiments, the clamping unit 550 may be spaced apart by a set interval (for example, a predetermined interval) from the first jig 510, and supports the cover window 310. For convenience of description, however, it will be assumed that the clamping unit 550 is disposed adjacent to the second jig 520.

The clamping unit 550 supports one or more ends of the display panel 330 and the adhesive layer 320 when they are inserted into the clamping unit 550. In FIGS. 5 through 6C, a plurality of clamping units 550 are provided, where a distance between the clamping units 550 is less than the at least one of a length or a width of the panel member (for example, display panel 330) when the clamping units 550 are fixing the display panel 330. The panel member may include at least one of the display panel 330 or the TSP as described above. Particularly, each of the clamping units 550 is placed at both ends of the cover window 310 in the direction of the at least one of a width or a length of the cover window 310. For convenience of description, however, it will be assumed that a distance between the plurality of clamping units 550 is less than a width of the display panel 330 and the panel member includes the display panel 330.

In FIGS. 5 through 6C, the clamping units 550 face respective side surfaces of the second jig 520, and fix respective ends of the display panel 330 and the adhesive layer 320. The clamping units 550 include a first clamping unit 551 and a second clamping unit 552 that are spaced apart by a set interval (for example, a predetermined interval) from each other.

Accordingly, the apparatus 500 may rapidly and easily manufacture the display device 300 having a curved shape and a simple structure. In addition, since the apparatus 500 may accurately laminate the cover window 310 having a curved shape to the display panel 330, a defect rate may be reduced or minimized. Further, since the apparatus 500 includes the clamping unit 550 to accurately align the display panel 330 and the cover window 310, working efficiency may be improved.

A method of manufacturing the display device 300 by using the apparatus 500 will now be described with reference to FIGS. 6A through 6C.

First, the cover window 310 is formed, the display panel 330 is formed, and then the adhesive layer 320 is attached to the display panel 330. The cover window 310 may be mounted on the first jig 510 as described above (see FIG. 6A). Next, respective ends of the display panel 330 on which the adhesive layer 320 is attached are fixed to the first clamping unit 551 and the second clamping unit 552. For example, the respective ends of the display panel 330 may be fixed by being inserted into insertion grooves formed in the first clamping unit 551 and the second clamping unit 552.

Once the display panel 330 and the adhesive layer 320 are fixed in this manner, middle portions of the display panel 330 and the adhesive layer 320 are curved upward (for example, with respect to a gravity direction). As shown in FIGS. 6B and 6C, since a distance S2 between the first clamping unit 551 and the second clamping unit 552 is less than at least one of a width or a length of the display panel 330, the middle portions of the display panel 330 protrude toward the first jig 510. When the display panel 330 and the adhesive layer 320 are fixed, the display panel 330, the adhesive layer 320, and the cover window 310 may be compressed by moving at least one of the first jig 510 or the second jig 520. For convenience of description, it will be assumed that the display panel 330, the adhesive layer 320, and the cover window 310 are compressed by moving both the first jig 510 and the second jig 520.

When the first jig 510 and the second jig 520 move, the first driving unit 515 and the second driving unit 525 may operate to move the first jig 510 and the second jig 520 closer to each other. The middle portions of the display panel 330 and the adhesive layer 320 (which are curved downward) then contact the cover window 310. For example, the middle portions of the display panel 330 and the adhesive layer 320 may first contact a portion of the flat portion 311. When the first jig 510 and the second jig 520 continuously move, the display panel 330 and the adhesive layer 320 are adhered to the cover window 310 from the flat portion 311 as the first contacting portion to the curved portions 312. That is, the display panel 330, the adhesive layer 320, and the cover window 310 contact in an order from the flat portion 311 to the curved portions 312.

At some point (for example, after the adhesive layer 320 contacts the flat portion 311), the second jig 520 may contact the display panel 330, the display panel 330 may detach from the clamping unit 550, and the first jig 510 and the second jig 520 may move closer to each other to further laminate the display panel 330 to the cover window 310.

In particular, when the cover window 310 and the display panel 330 contact each other as described above, a load range applied when the first jig 510 and the second jig 520 compress the cover window 310 and the display panel 330 may be greater than or equal to 0.3 MPa and equal or less than 0.5 MPa. When the load range is less than 0.3 MPa, an adhesive force between the cover window 310 and the display panel 330 may be reduced, and thus the cover window 310 and the display panel 330 may be delaminated and separated from each other. In addition, when the load range exceeds 0.5 MPa, when the cover window 310 and the display panel 330 are attached to each other, the cover window 310 and the display panel 330 may be damaged, thereby reducing quality and reliability.

Accordingly, the method may rapidly and accurately manufacture the display device 300 having a curved shape. In addition, since the method may accurately laminate the cover window 310 having a curved shape to the display panel 330, a defect rate may be reduced or minimized. Further, since the method removes air bubbles that may be formed (or prevents air bubbles from being formed) after the display panel 330 and the curved portions 312 are compressed, product quality may be improved.

According to embodiments of the present invention, since a cover window that is partially curved and a display panel are rapidly and accurately laminated to each other, mass production, high reliability, and high quality may be achieved. In addition, since a display device may be manufactured rapidly, manufacturing time and costs may be reduced.

Figure 7:
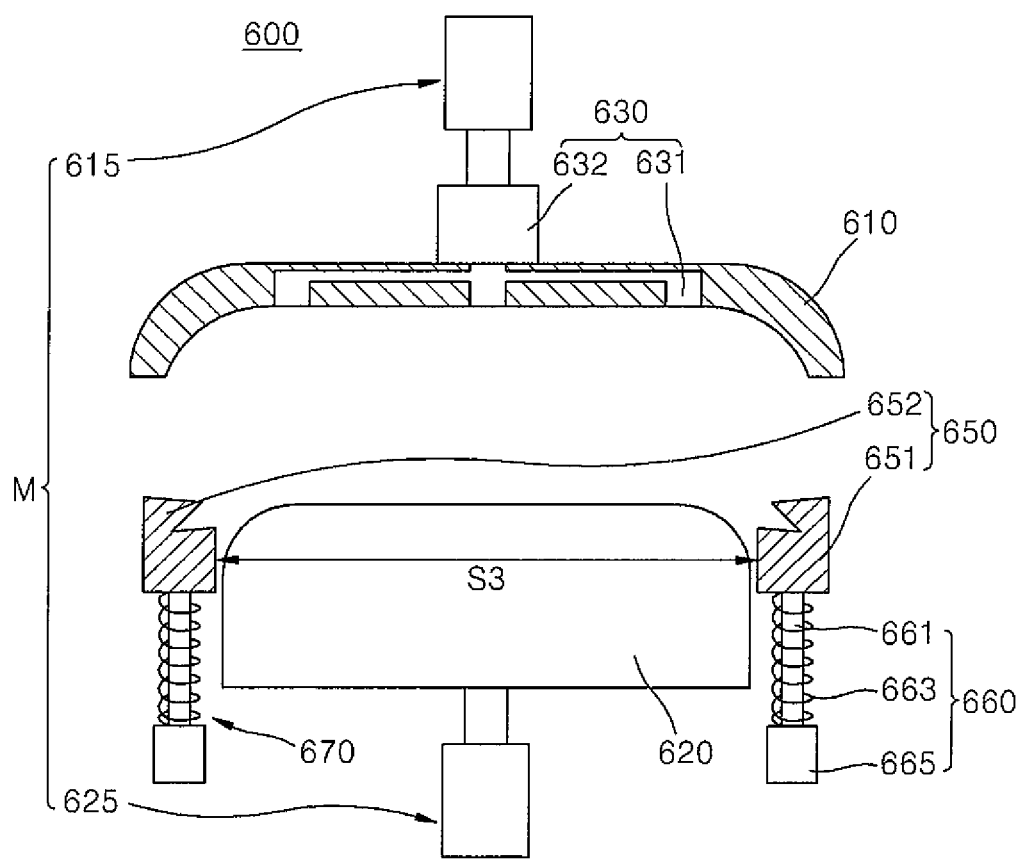
FIG. 7 is a cross-sectional view illustrating an apparatus for manufacturing the display device according to still yet another embodiment of the present invention.
Figure 8:
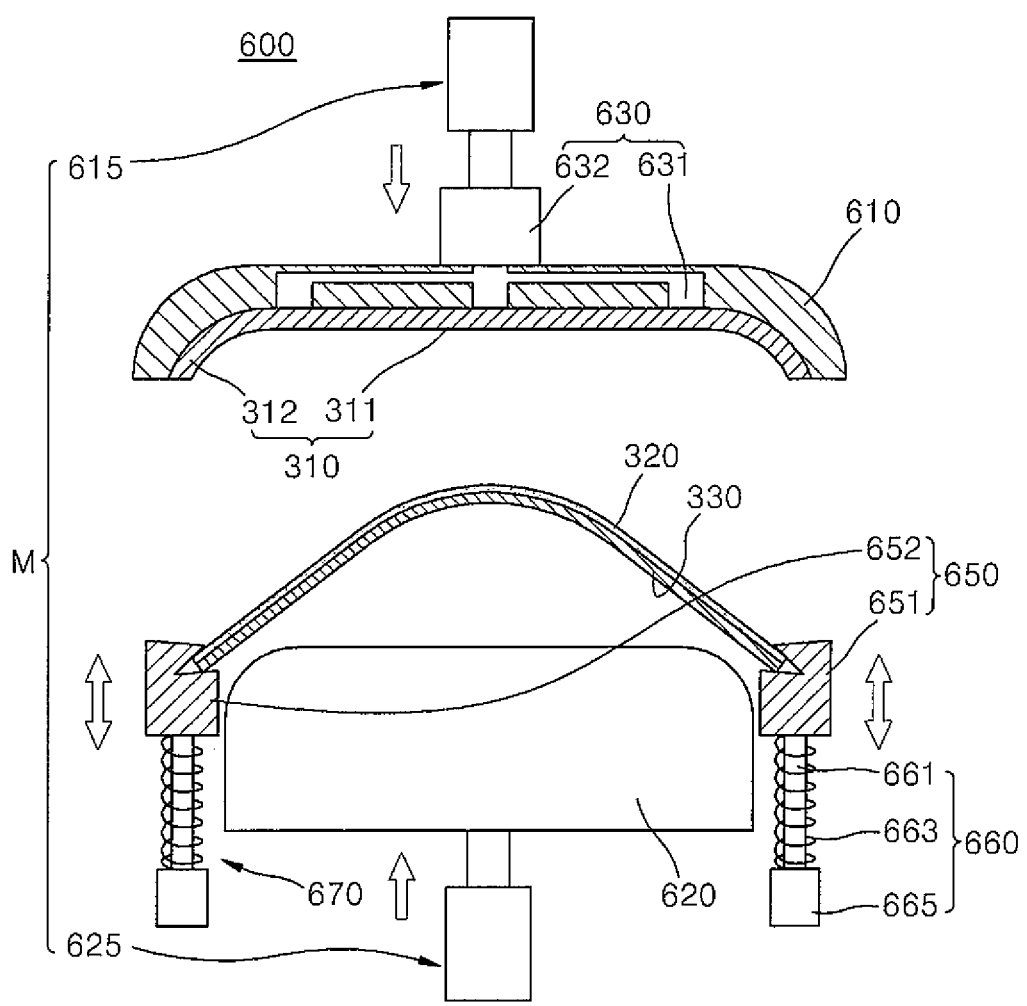
FIG. 8 is a cross-sectional view illustrating a method of manufacturing the display device according to still yet another embodiment of the present invention.

FIG. 7 is a cross-sectional view illustrating an apparatus 600 for manufacturing the display device 300 according to still yet another embodiment of the present invention. FIG. 8 is a cross-sectional view illustrating a method of manufacturing the display device 300 according to still yet another embodiment of the present invention.

Referring to FIGS. 7 and 8, the apparatus 600 includes a first jig 610, a second jig 620, a driving unit M (including first driving unit 615 and second driving unit 625), a clamping unit 650, and a fixing unit (for example, first fixing unit 630). The first jig 610 and the second jig 620 may be substantially the same as those described above and thus, a detailed description thereof will not be repeated.

The driving unit M may include the first driving unit 615 and the second driving unit 625, and the fixing unit may include the first fixing unit 630. The first driving unit 615, the second driving unit 625, and the first fixing unit 630 may be substantially the same as those described above and thus, a detailed description thereof will not be repeated. The first fixing unit 630 may include a first absorption unit 631 and a first absorption pump 632.

The clamping unit 650 may include a first clamping unit 651 and a second clamping unit 652. The first clamping unit 651 and the second clamping unit 652 may be substantially the same as those described above and thus, a detailed description thereof will not be repeated.

The apparatus 600 may include a first linear driving unit 660 and a second linear driving unit 670 which respectively vertically move the first clamping unit 651 and the second clamping unit 652 (for example, in a vertical direction with respect to gravity). The first linear driving unit 660 and the second linear driving unit 670 may be formed similarly and thus, the following description will focus on the first linear driving unit 660.

The first linear driving unit 660 may include a first shaft 661 that is connected to the first clamping unit 651 and linearly moves. In one embodiment, the first linear driving unit 660 may include a first driving module 665 that drives the first shaft 661. The first driving module 665 may include, for example, a cylinder or a motor. For convenience of description, however, it will be assumed that the first driving module 665 includes a motor. It will be further assumed that the first shaft 661 includes a ball screw that is lowered or raised as the first driving module 665 rotates.

The first linear driving unit 660 may include a first elastic unit 663 that surrounds the first shaft 661. The first elastic unit 663 may include a compression spring, and may be formed of an elastic material such as rubber. For convenience of description, however, it will be assumed that the first elastic unit 663 includes a compression spring. The first elastic unit 663 may surround an outer surface of the first shaft 661 as described above and thus may provide a restoring force to the first clamping unit 651 when the first clamping unit 651 moves.

A method of manufacturing the display device 300 by using the apparatus 600 will be described. The cover window 310 and a panel member (for example, display panel 330) may be formed, and then the adhesive layer 320 may be formed on the panel member. The panel member may include at least one of the display panel 330 or the TSP as described above. However, for convenience of description, it will be assumed that the panel member includes the display panel 330. Respective ends of the display panel 330 on which the adhesive layer 320 is formed may be fixed to the first clamping unit 651 and the second clamping unit 652. Once the display panel 330 is fixed to the first clamping unit 651 and the second clamping unit 652, middle portions of the display panel 330 and the adhesive layer 320 may be curved upward (for example, with respect to a gravity direction). In further detail, since a distance S3 between the first clamping unit 651 and the second clamping unit 652 is less than at least one of a width or a length of the display panel 330, the middle portions may protrude toward the first jig 610. In this case, it will be assumed that the distance S3 between the first clamping unit 651 and the second clamping unit 652 is less than a width of the display panel 330.

After the display panel 330 and the adhesive layer 320 are disposed in this manner, the display panel 330, the adhesive layer 320, and the cover window 310 may be compressed against one another by moving at least one of the first jig 610 or the second jig 620. For convenience of description, however, it will be assumed that the display panel 330, the adhesive layer 320, and the cover window 310 are compressed by moving both the first jig 610 and the second jig 620.

While the first jig 610 and the second jig 620 move in this manner, the first linear driving unit 660 and the second linear driving unit 670 may operate to vertically move the first clamping unit 651 and the second clamping unit 652. The first clamping unit 651 and the second clamping unit 652 may move at a speed similar to a speed at which the second jig 620 moves.

When the second jig 620, the first clamping unit 651, and the second clamping unit 652 are raised in this manner, the display panel 330 and the adhesive layer 320 may be raised while maintaining their curved states. When a distance between the first jig 610 and the second jig 620 reaches a set distance (for example, a predetermined distance), the first clamping unit 651 and the second clamping unit 652 may release from (for example, reduce their clamping force from) the display panel 330 and the adhesive layer 320. During or after this releasing of the first clamping unit 651 and the second clamping unit 652, the first linear driving unit 660 and the second linear driving unit 670 may lower the first clamping unit 651 and the second clamping unit 652.

Next, the first driving unit 615 and the second driving unit 625 may continuously operate to bring the first jig 610 and the second jig 620 closer (for example, adjacent) to each other (for example, the second jig 520 may contact the display panel 330). As the first jig 610 and the second jig 620 move closer, the display panel 330, the adhesive layer 320, and the cover window 310 may be compressed against one another (e.g., starting with the flat portion 311). A method of compressing the display panel 330, the adhesive layer 320, and the cover window 310 may be performed in the same manner as that described above and thus, a detailed description thereof will not be repeated.

In particular, when the cover window 310 and the display panel 330 contact each other, a load range applied when the first jig 610 and the second jig 620 compress the cover window 310 and the display panel 330 may be greater than or equal to 0.3 MPa and less than or equal to 0.5 MPa. When the load range is less than 0.3 MPa, an adhesive force between the cover window 310 and the display panel 330 may be reduced, and the cover window 310 and the display panel 330 may be delaminated and separated from each other. In addition, when the load range exceeds 0.5 MPa and the cover window 310 and the display panel 330 are attached to each other, the cover window 310 and the display panel 330 may be damaged, thereby reducing quality and reliability.

Accordingly, the method may rapidly and accurately manufacture the display device 300 having a curved shape. Further, the method may reduce or minimize a defect rate by accurately laminating the cover window 310 having a curved shape to the display panel 330. In addition, the method may improve product quality by removing air bubbles that may be generated (or preventing air bubbles from being generated) after the display panel 330 and the curved portions 312 are compressed.

Figure 9:
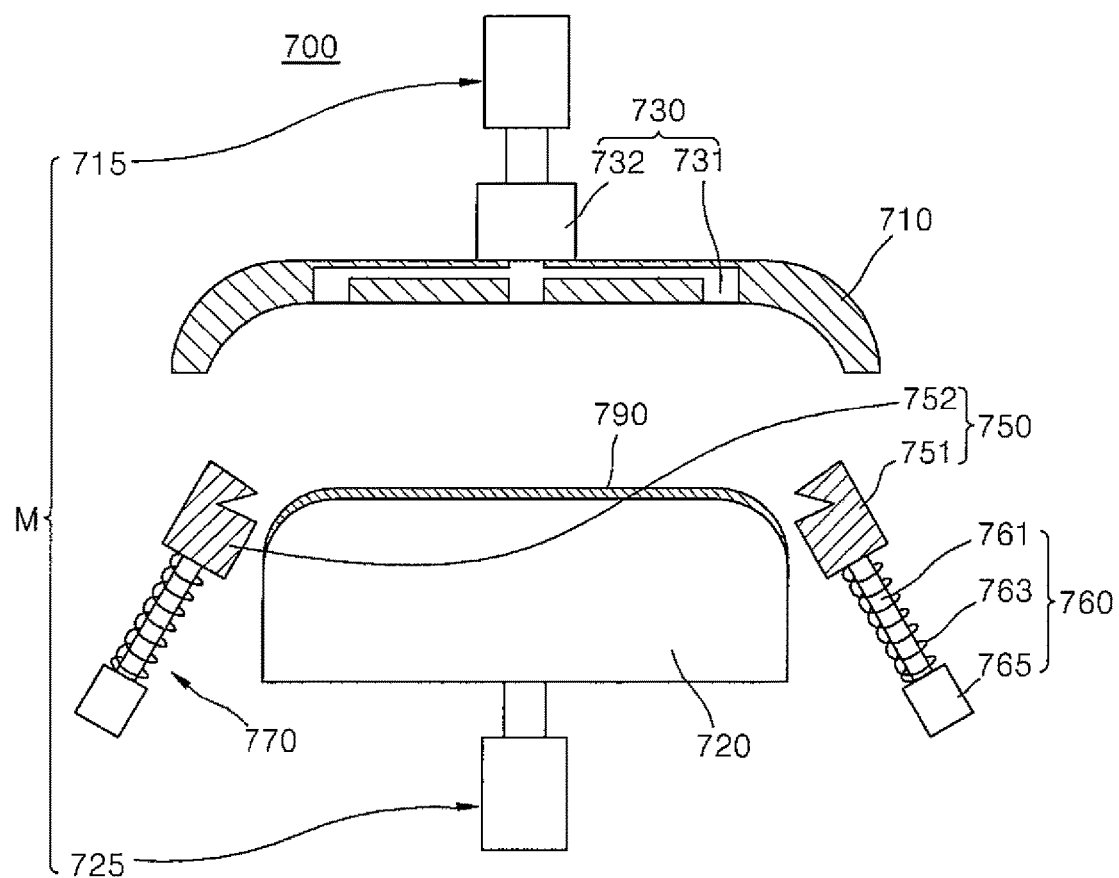
FIG. 9 is a cross-sectional view illustrating an apparatus for manufacturing the display device according to still yet another embodiment of the present invention.
Figure 10:
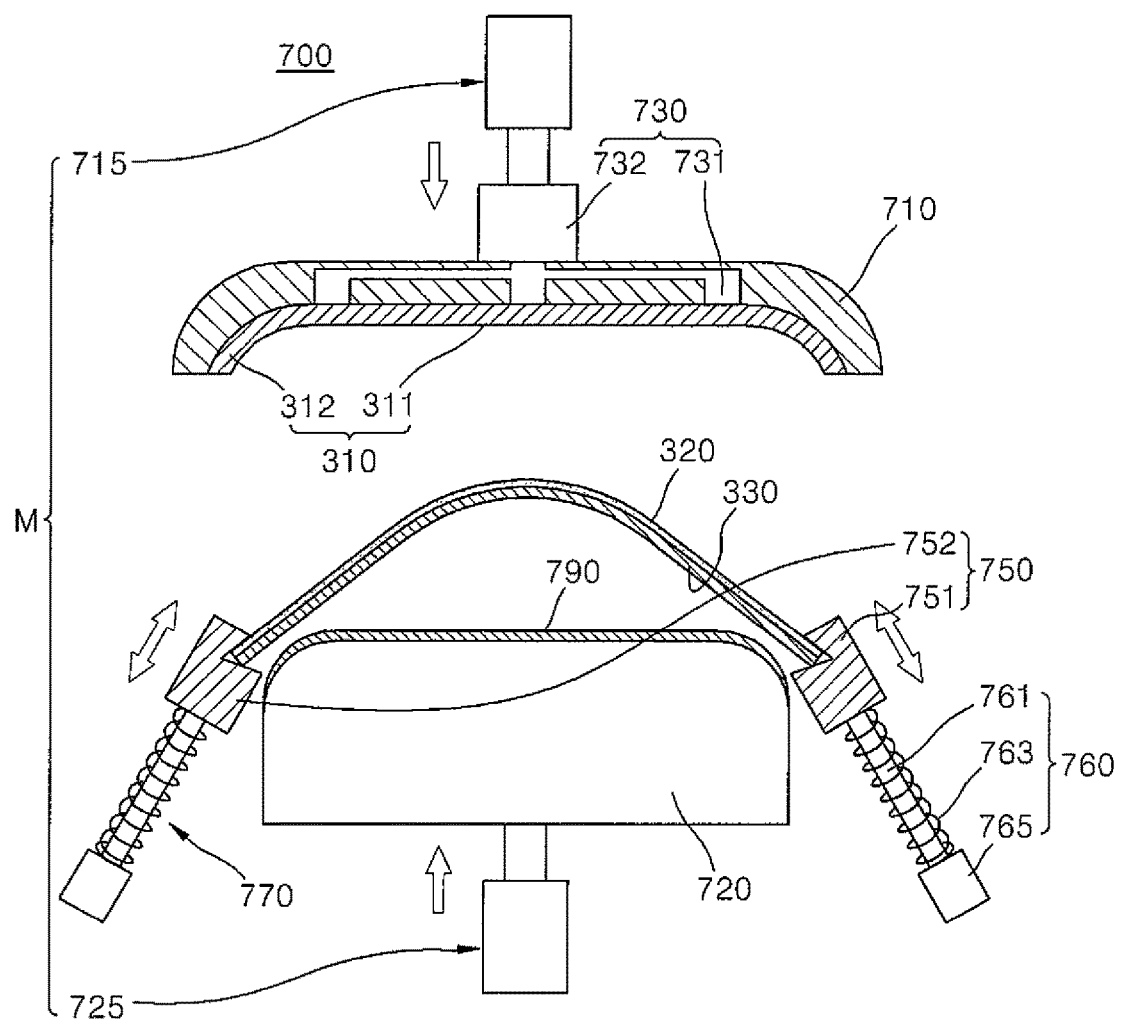
FIG. 10 is a cross-sectional view illustrating a method of manufacturing the display device according to still yet another embodiment of the present invention.

FIG. 9 is a cross-sectional view illustrating an apparatus 700 for manufacturing the display device 300 according to still yet another embodiment of the present invention. FIG. 10 is a cross-sectional view illustrating a method of manufacturing the display device 300 according to still yet another embodiment of the present invention.

Referring to FIGS. 9 and 10, the apparatus 700 may include a first jig 710, a second jig 720 (including a cushion unit 790), a driving unit M (including first driving unit 715 and second driving unit 725), a clamping unit 750 (including a first clamping unit 751 and a second clamping unit 752), a fixing unit (for example, first fixing unit 730), a first linear driving unit 760, and a second linear driving unit 770. The first jig 710 and the second jig 720 may be substantially the same as those described above and thus, a detailed description thereof will not be repeated.

The driving unit M may include the first driving unit 715 and the second driving unit 725, and the fixing unit may include the first fixing unit 730. The first driving unit 715, the second driving unit 725, and the first fixing unit 730 (which includes first absorption unit 731 and first absorption pump 732) may be substantially the same as those described above and thus, a detailed description thereof will not be repeated.

The first linear driving unit 760 and the second linear driving unit 770 may linearly move the first clamping unit 751 and the second clamping unit 752, respectively. The first linear driving unit 760 and the second linear driving unit 770 may linearly move the first clamping unit 751 and the second clamping unit 752 in a diagonal direction, respectively, with respect to the second jig 720 (and, for example, with respect to a gravity direction). Since the second linear driving unit 770 may be formed similarly to the first linear driving unit 760, the following description will focus on the first linear driving unit 760.

In further detail, the first linear driving unit 760 may include a first shaft 761, a first driving module 765, and a first elastic unit 763. The first shaft 761, the first driving module 765, and the first elastic unit 763 may be formed in a similar manner to those described above (such as the first linear driving unit 660 in FIGS. 7-8) except that, the first shaft 761 is disposed in a diagonal direction to diagonally move the first clamping unit 751 with respect to the second jig 720.

When the first linear driving unit 760 operates, the first driving module 765 may vary a length of the first shaft 761. Since the first driving module 765 and the first shaft 761 are diagonally disposed with respect to the second jig 720 as described above, the first clamping unit 751 may be diagonally moved by varying the movement of the first shaft 761.

For example, when the first driving module 765 operates to diagonally move the first shaft 761 downward with respect to the second jig 720, the first clamping unit 751 may diagonally move downward with respect to the second jig 720 as the first shaft 761 moves. Likewise, when the first driving module 765 operates in an opposite direction to diagonally move the first shaft 761 upward with respect to the second jig 720, the first clamping unit 751 may diagonally move upward with respect to the second jig 720 as the first shaft 761 moves. The first shaft 761 may include a ball screw as described above and thus may rotate as the first driving module 765 operates. The first shaft 761 may diagonally move downward or upward with respect to the second jig 720 as the first driving module 765 rotates.

The cushion unit 790 may be formed in various ways. For example, the cushion unit 790 may be part of an outer surface (e.g., a contacting surface, such as a surface that contacts the cover window 310 or the display panel 330) of at least one of the first jig 710 or the second jig 720. In another embodiment, the cushion unit 790 may be part of a portion of such an outer surface of at least one of the first jig 710 or the second jig 720. In another embodiment, the cushion unit 790 is part of the apparatus 700 and covers such an outer surface of at least one of the first jig 710 or the second jig 720. For ease of description, it will be assumed that the cushion unit 790 is part of an entire such outer surface of the second jig 720.

A method of manufacturing the display device 300 may be similar to that described above. In further detail, a panel member (for example, display panel 330) and the cover window 310 may be prepared, and then the adhesive layer 320 may be applied to the panel member. The panel member may include the display panel 330 and the TSP as described above. However, for convenience of description, it will be assumed that the panel member includes the display panel 330. The display panel 330 to which the adhesive layer 320 is applied may be fixed by the first clamping unit 751 and the second clamping unit 752. When the fixing is completed, the display panel 330, the adhesive layer 320, and the cover window 310 may be compressed against one another by moving at least one of the first jig 710 or the second jig 720. A method of compressing the display panel 330, the adhesive layer 320, and the cover window 310 may be similar to that described above and thus, a detailed description thereof will not be repeated.

When the first jig 710 and the second jig 720 move in this manner, the first clamping unit 751 and the second clamping unit 752 may also move. The first clamping unit 751 and the second clamping unit 752 may be diagonally moved by the first linear driving unit 760 and the second linear driving unit 770, respectively. The first clamping unit 751 and the second clamping unit 752 may be raised diagonally with respect to the second jig 720.

When the first clamping unit 751 and the second clamping unit 752 are raised and then an interval between the first jig 710 and the second jig 720 reaches a preset interval, both ends of the display panel 330 may be released from the clamping unit 750. The display panel 330 may be laminated to the cover window 310 by the adhesive layer 320 beginning from a middle portion of the display panel 330 (corresponding to the flat portion 311 of the cover window 310).

During or after the releasing of the first clamping unit 751 and the second clamping unit 752 from the display panel 330, the first linear driving unit 760 and the second linear driving unit 770 may operate to lower the first clamping unit 751 and the second clamping unit 752. The first clamping unit 751 and the second clamping unit 752 may be lowered diagonally with respect to the second jig 720. While the first clamping unit 751 and the second clamping unit 752 are lowered, the first jig 710 and the second jig 720 may get closer to each other to compress the display panel 330, the adhesive layer 320, and the cover window 310 against one another. For example, the second jig 720 may contact the display panel 330. A method of adhering the display panel 330 and the cover window 310 through compression may be similar to that described above.

When the display panel 330 and the cover window 310 are compressed by moving the first jig 710 and the second jig 720, the cushion unit 790 may spread a force applied to the display panel 330 and the cover window 310. In addition, the cushion unit 790 may help prevent the display panel 330 or the cover window 310 from being damaged by partially absorbing a force applied to the display panel 330 and the cover window 310.

In particular, when the cover window 310 and the display panel 330 contact each other, a load range applied when the first jig 710 and the second jig 720 compress the cover window 310 and the display panel 330 may be greater than or equal to 0.3 MPa and less than or equal to 0.5 MPa. When the load range is less than 0.3 MPa, an adhesive force between the cover window 310 and the display panel 330 may be reduced, and the cover window 310 and the display panel 330 may be delaminated and separated from each other. In addition, when the load range exceeds 0.5 MPa and the cover window 310 and the display panel 330 are attached to each other, the cover window 310 and the display panel 330 may be damaged, thereby reducing quality and reliability.

Accordingly, the method may rapidly and accurately manufacture the display device 300. Further, the method may reduce or minimize a defect rate by accurately laminating the cover window 310 having a curved surface to the display panel 330. In addition, the method may improve product quality by removing air bubbles that may be generated (or preventing air bubbles from being generated) after the display panel 330 and the curved portions 312 are compressed.

This application relates in general to a display device and more particularly, to a corresponding method and apparatus for manufacturing the display device that may rapidly, accurately, and cleanly manufacture the display device having a curved shape. Small electronic devices having curved display devices have presented challenges in accurately forming and aligning their corresponding cover windows (for example, transparent protective covers) and display panels (such as OLED display panels or flexible OLED display panels), and adhering the cover windows to the display panels via transparent adhesive without quality defects such as air bubbles between the cover windows and the display panels.

Embodiments of the present invention address these problems by providing an apparatus and method for manufacturing the display device. The cover window is fabricated with a curved shape (such as rounded edges, inward or outward) and mounted on a first jig having a mount surface that conforms to the cover window. For example, the cover window may sit in the first jig (through gravity) or attach to the first jig via a fixing unit, such as a vacuum suction device. Meanwhile, the display panel (to which the adhesive layer is attached), is attached to a second jig by similar means. The distance between the jigs is then closed (by moving one or both jigs towards the other using, for example, driving units), allowing the display panel to press up to the cover window and adhere via the adhesive layer, and without forming air bubbles between the cover window and the display panel.

In another embodiment, the display panel may be attached to a clamp unit, such as a pair of clamps, and bent through a clamping force to mate cleanly with the cover window when the jigs are moved towards each other. The clamps may be moved via dedicated driving units (for example, which drive ball screws through rotational movement to move the clamps) independently of the jigs, and may move, for example vertically or diagonally with respect to the jigs (and with respect to a gravity direction). While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing a display device, the method comprising:

mounting a cover window comprising a flat portion having curved both ends on a first jig comprising a curved portion;
mounting a panel member on a second jig that conforms to a surface of the first jig; and
laminating the cover window to the panel member by moving at least one of a first one of the first jig or the second jig to a first other one of the first jig or the second jig to press the cover window and the panel member against each other.

2. The method of claim 1, wherein at least a portion of the panel member contacts a surface of the second jig.

3. A method of manufacturing a display device, the method comprising:
mounting a cover window comprising a flat portion having curved both ends on a first jig comprising a curved portion;
mounting a panel member on a second jig that conforms to a surface of the first jig; and
laminating the cover window to the panel member by moving at least one of a first one of the first jig or the second jig to a first other one of the first jig or the second jig, wherein
the panel member is bent along an outer surface of the second jig during the mounting of the panel member on the second jig.

4. The method of claim 1, wherein the panel member is smaller in at least one of a length or a width than the cover window.

5. A method of manufacturing a display device, the method comprising:
mounting a cover window comprising a flat portion having curved both ends on a first jig comprising a curved portion;
mounting a panel member on a second jig that conforms to a surface of the first jig; and
laminating the cover window to the panel member by moving at least one of a first one of the first jig or the second jig to a first other one of the first jig or the second jig, wherein
the panel member is flat during the mounting of the panel member on the second jig, and
the laminating of the cover window to the panel member comprises partially curving the panel member by the moving of the first one of the first jig or the second jig.

6. The method of claim 1, wherein the first one of the first jig or the second jig is above the first other one of the first jig or the second jig, or the first other one of the first jig or the second jig is above the first one of the first jig or the second jig.

7. The method of claim 1, wherein the first one of the first jig or the second jig is formed by protruding toward or recessing away from the first other one of the first jig or the second jig.

8. The method of claim 7, wherein the first other one of the first jig or the second jig is formed by recessing away from or protruding toward the first one of the first jig or the second jig.

9. The method of claim 1, wherein the mounting of the panel member comprises fixing the panel member to the second jig.

10. The method of claim 1, wherein the panel member is flexible.

11. The method of claim 1, wherein the panel member is attached to a recessed outer surface of the cover window or a protruding outer surface of the cover window.

12. The method of claim 1, wherein the panel member comprises at least one of a display panel or a touch screen panel (TSP).

13. The method of claim 1, wherein the cover window and the panel member are pressed against each other with a load of 0.3 MPa to 0.5 MPa.

14. The method of claim 1, wherein the cover window and the panel member are pressed against each other with an adhesive layer therebetween.

* * * * *